United States Patent [19]

Friederich et al.

[11] Patent Number: 5,093,753

[45] Date of Patent: Mar. 3, 1992

[54] MAGNETIC READING HEAD USING THE HALL EFFECT

[75] Inventors: Alain Friederich; Gérard Creuzet, both of Paris, France

[73] Assignee: Thomson-CSF, Puteaux, France

[21] Appl. No.: 535,900

[22] Filed: Jun. 11, 1990

[30] Foreign Application Priority Data

Jun. 27, 1989 [FR] France .................. 89 08561

[51] Int. Cl.[5] .................. G11B 5/37; G11B 5/147
[52] U.S. Cl. .................. 360/112; 360/126
[58] Field of Search .................. 360/112, 126, 113

[56] References Cited

U.S. PATENT DOCUMENTS

| | | | |
|---|---|---|---|
| 4,179,719 | 12/1979 | Imamura & Mimura | 360/112 |
| 4,584,552 | 4/1986 | Suzuki et al. | 338/32 M |
| 4,751,598 | 6/1988 | Hamilton | 360/126 X |

FOREIGN PATENT DOCUMENTS

| | | | |
|---|---|---|---|
| 3126775 | 4/1982 | Fed. Rep. of Germany | 360/112 |
| 8601114 | 9/1986 | France . | |
| 8606878 | 11/1986 | Japan . | |

OTHER PUBLICATIONS

IBM/TDB vol. 18, No. 12, May 1976, pg4218, "GdxFey and GdCoFe Malenals for Magnetic Head Hall Sensors", by Gambino et al.
Patent Abstracts of Japan, vol. 5 No. 122 (P-074).

Primary Examiner—John H. Wolff
Attorney, Agent, or Firm—Roland Plottel

[57] ABSTRACT

Disclosed is a magnetic reading head using the Hall effect. In this head, the active element comprises a substrate on which the following are epitaxially grown: a layer of a semiconductor material with high electron mobility and a magnetic metallic multilayer formed by stacked layers of magnetic materials and non-magnetic materials, the layer of semiconductor material and the multilayer being electrically insulated from each other. This head also has electrodes for current supply and Hall voltage detection that are in contact with the layer of semiconductor material. The disclosed device can be applied to the reading of magnetic recording media.

15 Claims, 3 Drawing Sheets

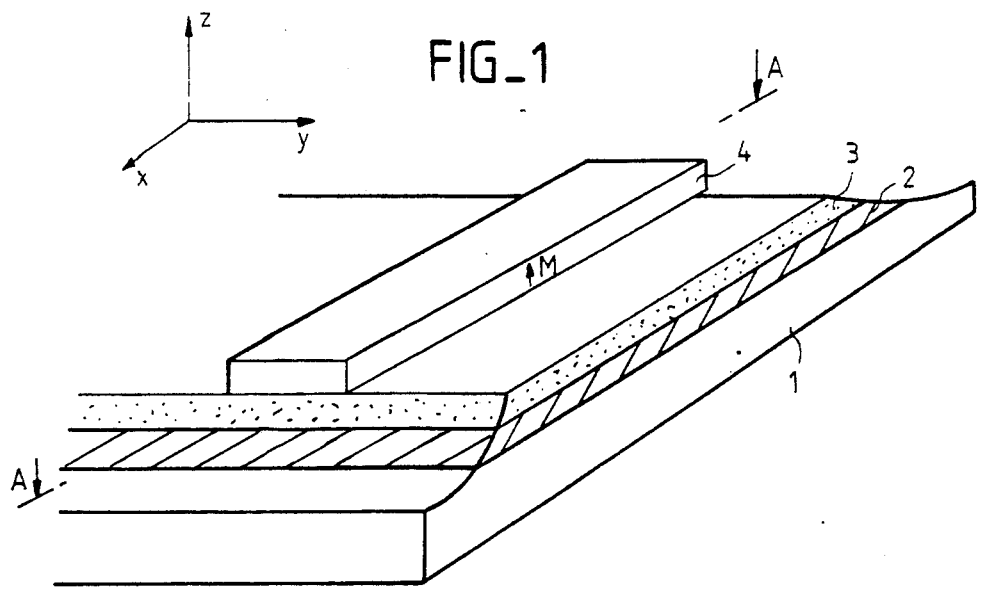
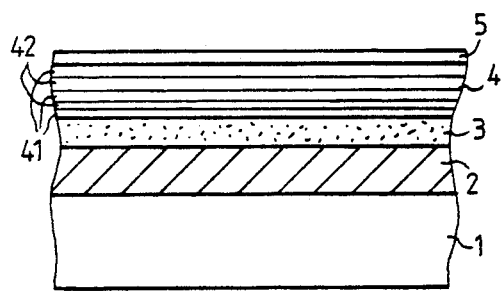 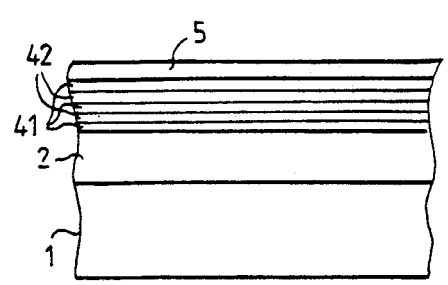

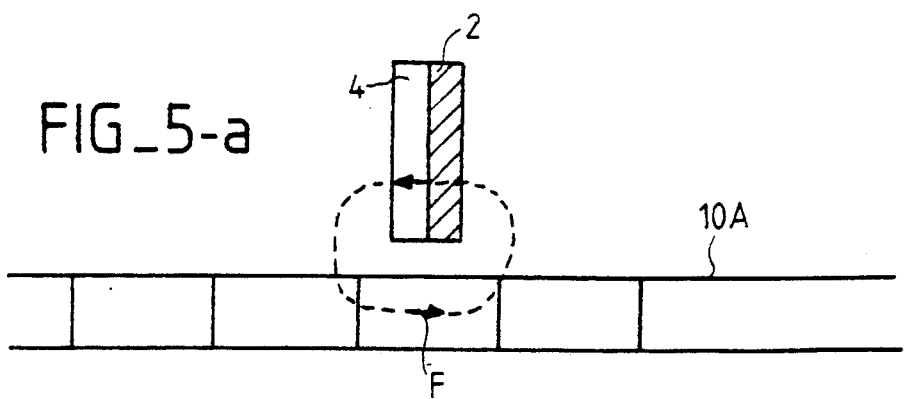
FIG_5-a
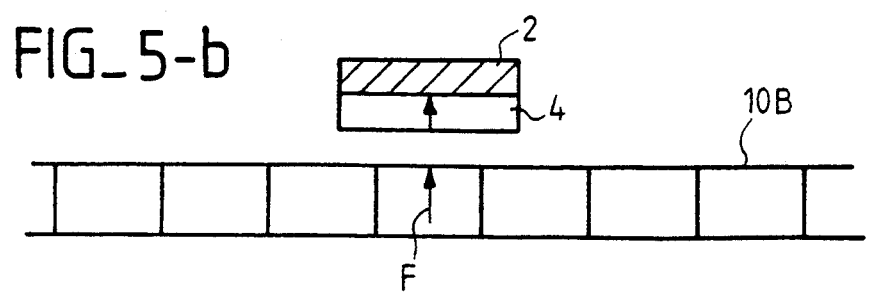
FIG_5-b
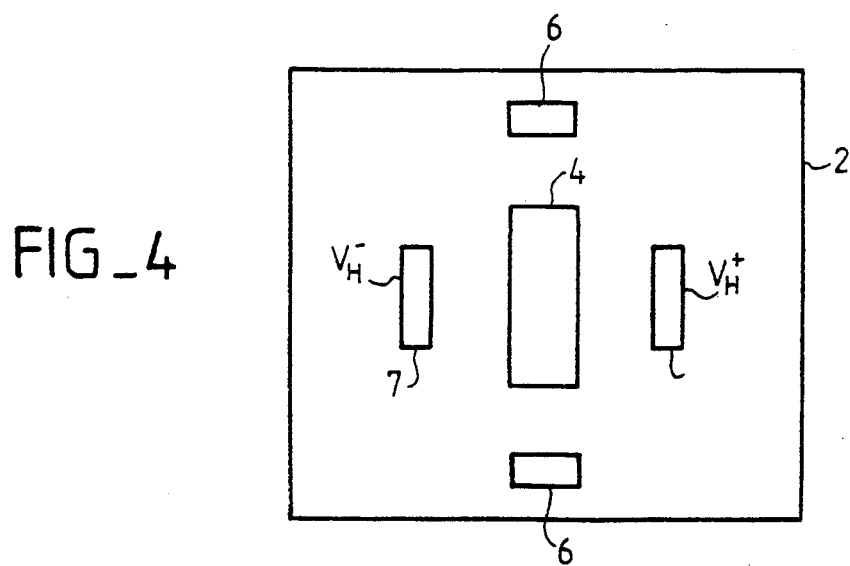
FIG_4
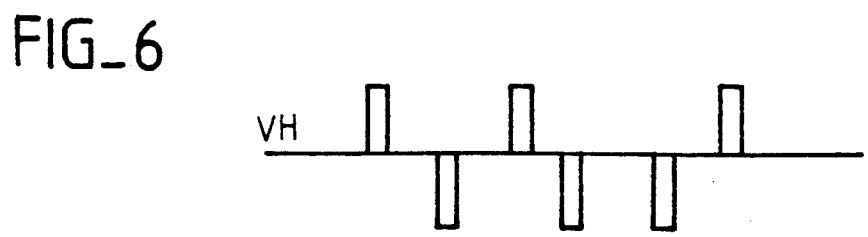
FIG_6

FIG_7
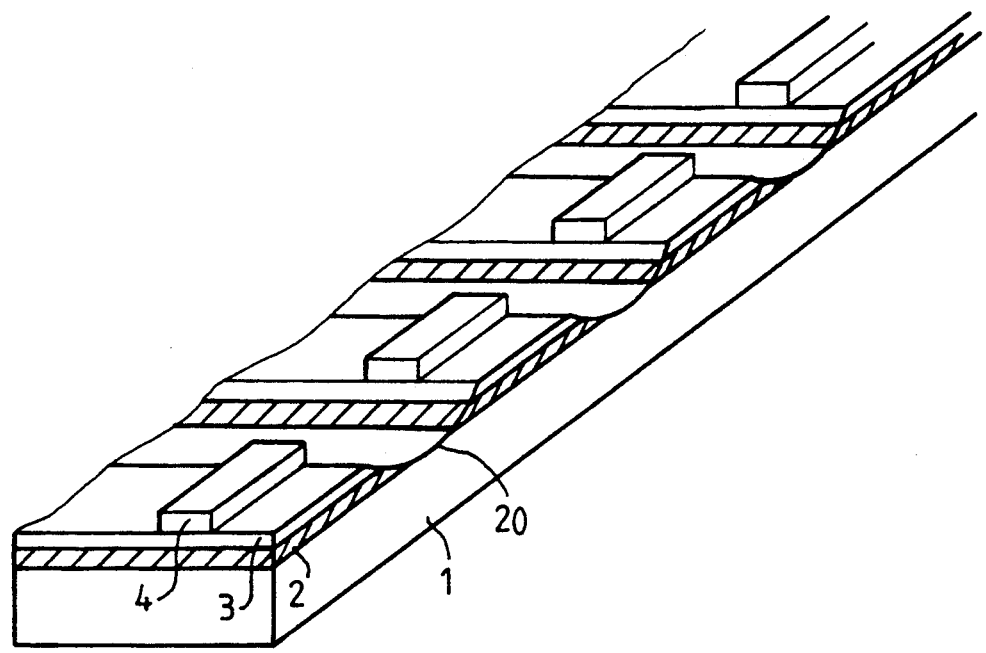

MAGNETIC READING HEAD USING THE HALL EFFECT

BACKGROUND OF THE INVENTION

1. Field of the Invention

The present invention concerns magnetic heads for the reading of recordings, more particularly single-track or multiple-track reading heads using the Hall effect.

2. Description of the Prior Art

At present, the materials generally used to make single-track or multiple-track magnetic recording heads are materials such as a permalloy, namely a ferro-nickel alloy with 78% of nickel. Now, one of the main drawbacks of these magnetic heads relates to noise. This noise is chiefly due to the domain characteristics of the magnetization. For, the alloys out of which the reading heads are made are not monocrystalline. Thus, the present invention is aimed at proposing a new structure for Hall effect magnetic heads for reading recordings, making it possible to obtain a monocrystal so as to resolve the above problem.

SUMMARY OF THE INVENTION

Consequently, an object of the present invention is a magnetic reading head using the Hall effect, wherein the active element of the head comprises a substrate on which the following are epitaxially grown: a layer of a semiconductor material with high electron mobility and a magnetic metallic multilayer formed by stacked layers of magnetic materials and non-magnetic materials, and electrodes for current supply and Hall voltage detection that are in contact with the layer of semiconductor material, with the layer of semiconductor material and the multilayer being electrically insulated from each other.

By epitaxially growing the magnetic metallic layer on the semiconductor material, a monocrystal is thus grown. The magnetization of this structure is therefore a mono-domain magnetization which leads to a restriction of the noise.

Furthermore, in order that the above structure may be used as a magnetic reading head, the multilayer has perpendicular anisotropy. In addition, it has an overall thickness ranging from 100 Å to 1000 Å. Thus, by using the interface anisotropy and making multilayers with sufficiently small thicknesses of individual layers, a magnetization is obtained that is perpendicular to the multilayer and is particularly favorable to the use of this multilayer as a reading head.

In the above structure, a concentration of flux lines, due mainly to the multilayer with perpendicular magnetization, is obtained. This concentration of flux lines generates a magnetic field in the semiconductor layer on which it is epitaxially grown. It is then possible to detect the modifications of the Hall voltage induced in the semiconductor layer during the modifications in magnetization of a magnetic recording support such as a magnetic tape.

According to another characteristic of the invention, so as not to disturb the detection of the Hall voltage, the magnetic reading head using the Hall effect further has an insulating layer between the layer made of a semiconductor material and the multilayer. This insulating layer is made, preferably, of insulator oxide or of a semiconductor material with a substantial gap height, such as GaAlAs. The Hall effect magnetic reading heads that have no insulator layers are made with materials such that the Schottky diode formed between the multilayer and the semiconductor layer does not leak. Consequently, there should be a sufficient barrier height between the first metal layer of the multiple-layer and the layer of semiconductor material.

BRIEF DESCRIPTION OF THE DRAWINGS

Other characteristics and advantages of the present invention will appear from the following description of various embodiments of a Hall effect magnetic reading head, said description being made with reference to the appended drawings, of which:

FIG. 1 is a schematic view, in perspective, of an embodiment of a Hall effect single-track magnetic reading head;

FIG. 2 is a sectional view through A—A of FIG. 1;

FIG. 3 is a sectional view, similar to that of FIG. 2, of another embodiment of a Hall effect magnetic head according to the present invention;

FIG. 4 is a top plane view, showing the arrangement of the contacts;

FIG. 5A and 5B are schematic views explaining the working of the reading heads according to the present invention;

FIG. 6 represents the range of the Hall voltage signals as a function of the magnetization of the tape read by the reading head, and FIG. 7 is a schematic view in perspective of a multiple-track Hall effect reading head according to the present invention.

In the figures, to simplify the description, the same references are repeated for the same elements. Furthermore, to make it easier to understand the figures, the different thicknesses of the layers have been enlarged.

DESCRIPTION OF PREFERRED EMBODIMENTS

As shown in FIG. 1, a Hall effect magnetic head according to the present invention consists essentially of a substrate 1 on which the following have been successively epitaxiated: a layer 2 made of a semiconductor material with high electron mobility, an insulator layer 3 and a multiple-layer 4 consisting of stacked layers of magnetic materials and non-magnetic materials. To obtain a monocrystal structure enabling the noise to be reduced, the above structure has been made by using specific epitaxial techniques such as molecular beam epitaxy. Furthermore, the substrate 1 is chosen so that the lattice parameters are compatible with the materials to be deposited, to make it possible for the epitaxy to be done. The semiconductor material with high electron mobility is chosen from among the compounds of the III and V groups of the periodic table of the elements, such as gallium arsenide (GaAs), or this material is doped silicon.

Thus, a possible structure for the head of FIGS. 1 and 2 is formed by a substrate 1 made of non-doped gallium arsenide and a layer 2 made of gallium arsenide that is doped so as to obtain the desired electron mobility. In this case, the insulator layer 3 may be made by means of a semiconductor material with a substantial barrier height such as, for example, GaAlAs. Other types of insulator layers may be used, notably, oxide-based insulator layers. The magnetic multiple-layer 4, which forms the active part of the reading head, should be capable of providing for a transcription of the information in the magnetic recording along a magnetization perpendicular to said multilayer. Consequently, this magnetic multilayer 4 is formed by a stacking of magnetic layers and non-magnetic layers, the magnetic layers 41 being preferably made of cobalt or of a cobalt alloy while the non-magnetic layers 42 are made of chrome, silver or an alloy of these metals. Furthermore, the thicknesses of the individual layers are small enough and are between some angstroms and 30 Å to 60 Å each, to obtain a multilayer having a thickness of between 100 Å and 1000 Å.

Thus, in using the interface anisotropy between the layers of the multilayer, and owing to the thickness of this multilayer, a magnetization perpendicular to the multilayer is obtained. This magnetization enables the multilayer to be used for the reading of a magnetic recording medium.

In fact, the structure of the multilayer used should have a perpendicular anisotropy, with an anisotropic energy:

$$E_a = K_{eff} \sin^2 \sigma, \text{ où } K_{eff} = K - 2\pi M^2$$

(K: coefficient of anisotropy) where $\sigma$ is the angle between the magnetization and the normal to the multilayer, and M is the magnetization. The hysteresis cycle of a multilayer such as this is essentially rectangular, the coercive force of the field being equal to:

$$H_c = 2K_{eff}/M$$

This field $H_c$ should be small enough for the magnetization of the multilayer to be reversed under the effect of the field created by the recording, when going from a given domain to the reverse domain in it (in practice $H_c = 100$ to 500 Oe depending on the type of recording). The thickness t of the multilayer should be small enough for its effect on the recording to be negligible, and small enough so that it does not modify this recording (i.e. $tMH_c << t'M'H_c'$ where t', M', $H_c'$ are respectively the thickness, the magnetization and the coercive force of the field of the magnetic tape).

According to another embodiment of the present invention, the insulator layer 3 provided between the semiconductor layer 2 and the multilayer 4 may be eliminated. In this case, the Schottky diode thus obtained should not leak. This implies that the barrier height between the first magnetic layer of the multilayer 4 and the semiconductor layer 2 should be sufficient.

This insulation is necessary so as not to disturb the detection of the magnetization of the multiple-layer by measurement of the Hall effect induced in the semiconductor layer as shall be explained in greater detail here below.

Again, as shown in FIGS. 2 and 3, the multilayer 4 may be covered with a protection layer 5. This protection layer is formed either by a nitride based layer or by a non-magnetic abrasion resistant layer.

As shown in FIG. 4, the reading head is provided with two pairs of electrodes 6,6 and 7,7 respectively designed for the current lead-in and the Hall voltage connectors VH− and VH+. These electrodes are made by deposition of a metal layer on the surface of the semiconductor layer 2. In the case of a reading head having an insulator layer, it is necessary to etch the insulating layer. After etching, contacts of very low resistance are deposited on the semiconductor layer 2.

As shown in FIGS. 5A and 5B, a reading head according to the present invention can be used both for the reading of a tape 10 A with longitudinal recording as shown in FIG. 5A and for the reading of a tape 10B with perpendicular recording as shown in FIG. 5B. In the former case, the reading head is placed perpendicularly to the tape. The flux lines are then oriented as shown by the line of dashes wherein the two arrows indicate the direction of the magnetization, respectively in the tape and in the multilayer of the head.

In the latter case, the reading head is positioned parallel to the tape.

With this type of head, the reading is done by combining two phenomena, namely:

a transcription of the information displayed in the magnetic recording into a magnetization perpendicular to the multilayer, as symbolized by the arrows F in the FIGS. 5A and 5B.

a detection of the magnetization of the multilayer by the measurement of the Hall effect induced in the semiconductor layer 2.

As shown in FIG. 6, the binary pieces of information are recorded in the magnetic tape 10 by magnetizations of opposite directions symbolized by the arrows F on the tape 10. This alternation of the domains of magnetization of the magnetic tape gives rise to a change in the direction of the magnetization in the magnetic metal multilayer, and hence a change in the sign of the Hall voltage VH measured in the semiconductor layer as shown in the graph of FIG. 6. The Hall voltage resulting from the flow of the tape beneath the magnetic head is therefore a digital type voltage which can be easily used.

As shown in FIG. 7, the structure of the above-described reading head can also be used for a multiple-track reading head. In this case, on a common substrate 1, a semiconductor layer 2 is made. This semiconductor layer 2 is coated with an insulator layer 3 and a multilayer 4. To make multiple tracks, the multilayer, the insulator layer and the semiconductor layer are etched, with the etching 20 attacking the substrate so as to isolate the heads from one another.

Thus, by using a multiple-layer structure to replace standard materials of the permalloy type, and by selecting the components and the thicknesses of the magnetic and non-magnetic layers forming the multilayer so as to obtain a perpendicular anisotropy giving a perpendicular magnetization, and also by using a specific method for making the multilayer so as to obtain a monocrystal, a reading head with a monocrystal is obtained, thus enabling the noise to be considerably reduced. Thus, there is obtained a reading head giving a digital type detection of the induced Hall voltage.

What is claimed is:

1. A magnetic reading head using the Hall effect, wherein the active element of the head comprises a substrate on which the following are epitaxially grown: a layer of a semiconductor material with high electron mobility and a magnetic metallic multilayer formed of substantially, coextensive stacked layers of magnetic materials and non-magnetic materials, and electrodes for current supply and Hall voltage detection that are in contact with the layer of semiconductor material, the layer of semiconductor material and the multilayer being electrically insulated from each other.

2. A reading head according to claim 1, wherein the multilayer has perpendicular anisotropy.

3. A reading head according to claim 1, wherein the non-magnetic material of the layers forming the multilayer is chosen from among chromium, silver or an alloy of these metals.

4. A reading head according to claim 1, wherein the non-magnetic material of the layers forming the multilayer is chosen from among cobalt or a cobalt alloy.

5. A reading head according to claim 1, wherein the multilayer has a thickness of between 100 Å and 1000 Å.

6. A reading head according to claim 1, wherein the semiconductor material with high electron mobility is chosen from among the compounds of the groups III and V of the periodic table of the elements such as GaAs.

7. A reading head according to claim 1, wherein the semiconductor material with high electron mobility consists of doped silicon.

8. A reading head according to claim 1, wherein the substrate is made of the same material as the semiconductor layer, but it is not doped.

9. A reading head according to claim 1, wherein the substrate, the layer of semiconductor material and the multilayer are made of materials having compatible lattice parameters.

10. A reading head according to claim 1, further comprising an insulating layer between the layer of semiconductor material and the multilayer.

11. A reading head according to claim 10, wherein the insulator layer is made of insulator oxide or of a semiconductor material with substantial gap height such as GaAlAs.

12. A reading head according to claim 1, wherein the multilayer is covered with a protection layer.

13. A reading head according to claim 12, wherein the protection layer is formed by a nitride-based layer or by an abrasion resistant non-magnetic layer.

14. A reading head according to claim 1, wherein at least the semiconductor layer and the multilayer are made by molecular beam epitaxy.

15. A multiple-track reading head, comprising several reading heads according to claim 1, made on a common substrate and separated from one another by etching.

* * * * *